United States Patent [19]

Gordon et al.

[11] Patent Number: 4,675,871
[45] Date of Patent: Jun. 23, 1987

[54] DIGITAL DATA DECODERS

[75] Inventors: John Gordon, Hatfield; Graham King, Sandridge, both of United Kingdom

[73] Assignee: Signal Processors Limited, Great Britain

[21] Appl. No.: 659,367

[22] Filed: Oct. 10, 1984

[30] Foreign Application Priority Data

Oct. 11, 1983 [GB] United Kingdom ............... 8327084

[51] Int. Cl.$^4$ ............................................. G06F 11/10
[52] U.S. Cl. ........................................ 371/46; 371/43
[58] Field of Search ............................ 371/43, 46, 47

[56] References Cited

U.S. PATENT DOCUMENTS

| | | | |
|---|---|---|---|
| 3,789,359 | 1/1974 | Clark | 371/46 |
| 3,872,432 | 3/1975 | Bismarck | 371/46 |
| 4,015,238 | 3/1977 | Davis | 371/43 |
| 4,240,156 | 12/1980 | Doland | 371/43 |
| 4,527,279 | 7/1985 | Yasuda | 371/46 |
| 4,536,878 | 8/1985 | Rattlingourd | 371/43 |
| 4,545,054 | 10/1985 | Davis | 371/43 |

*Primary Examiner*—Michael R. Fleming
*Assistant Examiner*—Robert W. Beausolieu, Jr.
*Attorney, Agent, or Firm*—Lerner, David, Littenberg, Krumholz & Mentlik

[57] ABSTRACT

A Viterbi decoder is provided with synchronization error detector which detects synchronization errors by monitoring the growth of the path metric associated with a state having itself as a predecessor and to indicate synchronization errors independently of the behavior of metrics associated with other states. The difference between the integral of the selected metric over a certain period of time and the sum of the absolute values of the input encoded data signal is determined and compared to a threshold to indicate whether or not a synchronization error exists.

15 Claims, 5 Drawing Figures

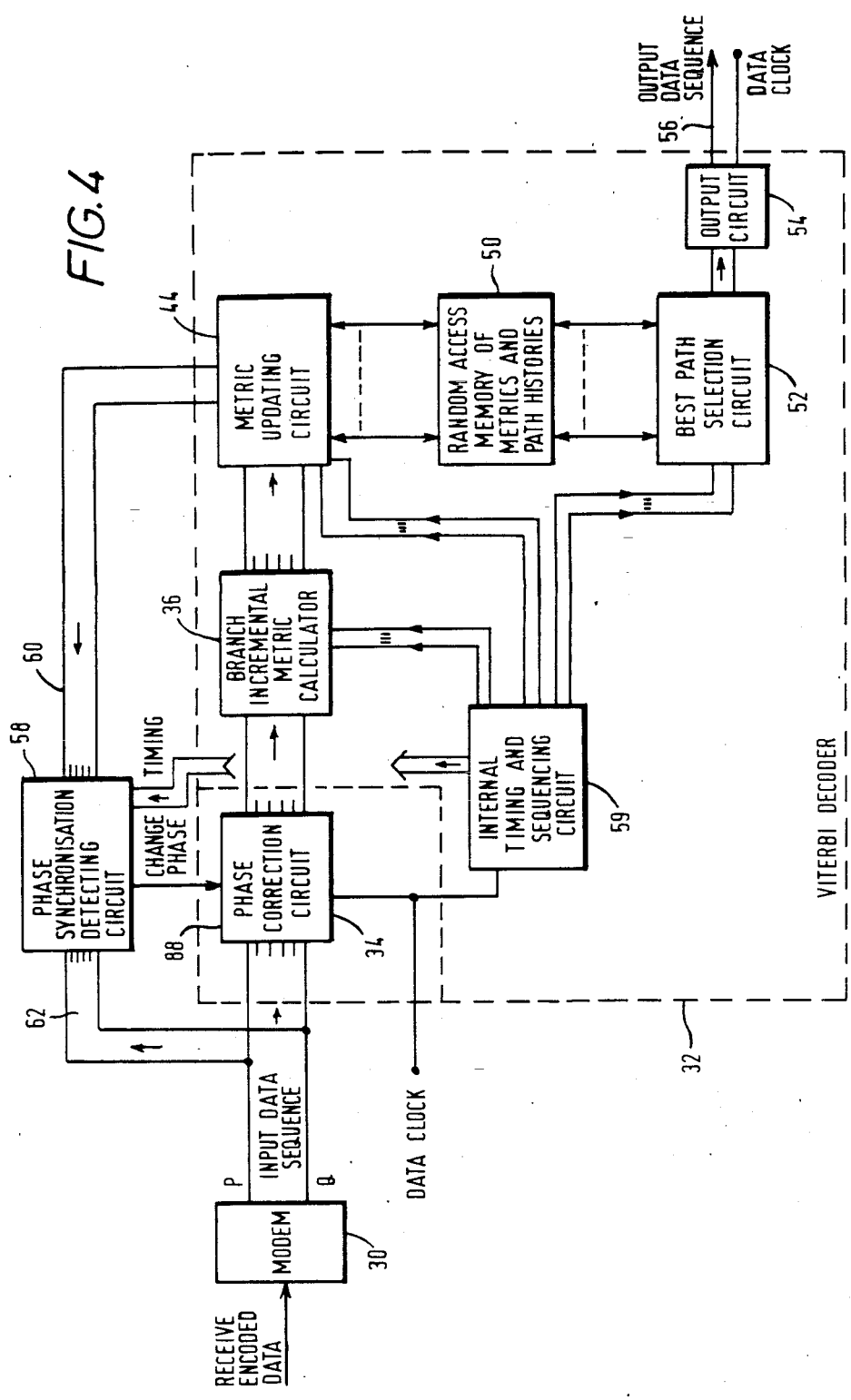

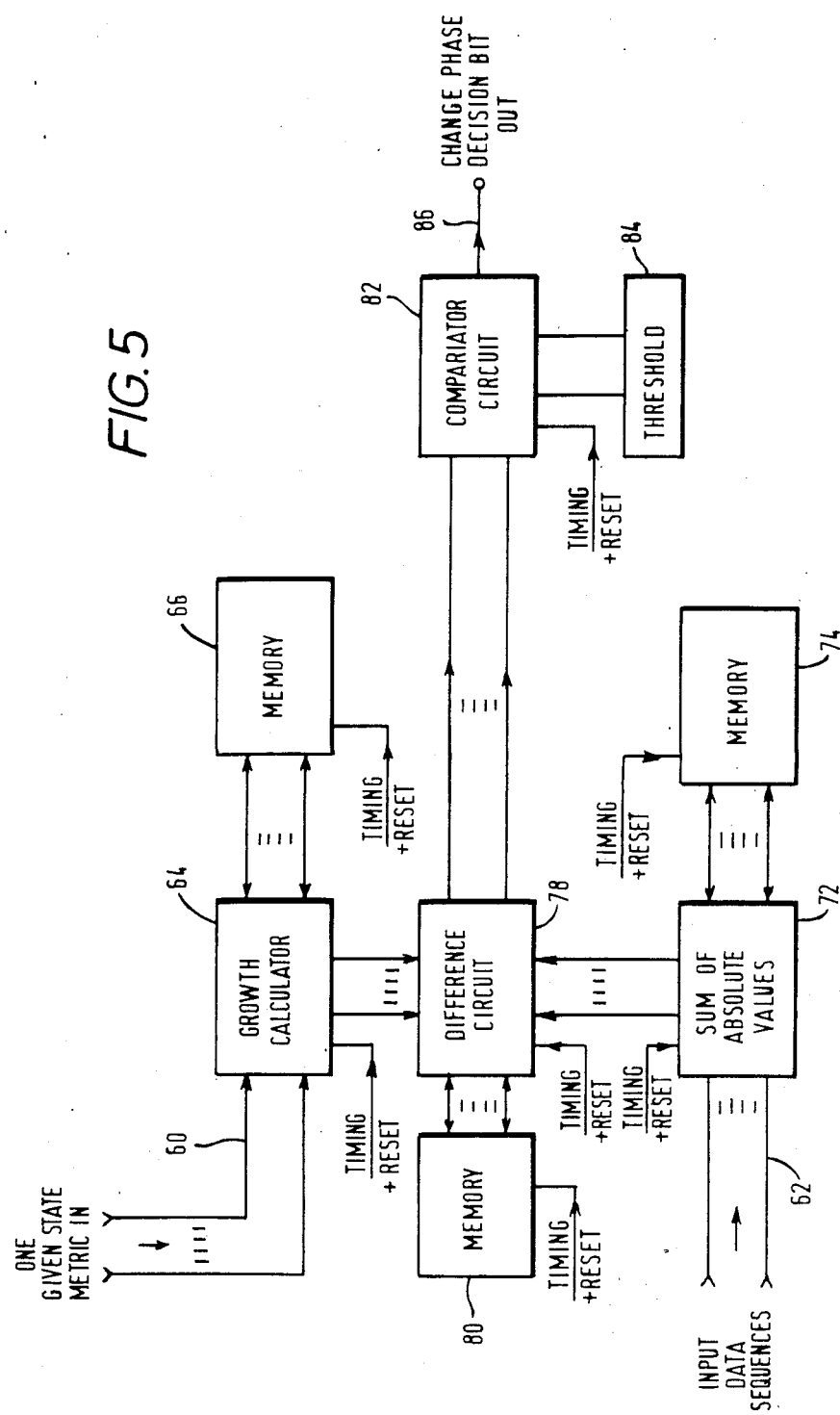

DIGITAL DATA DECODERS

This invention relates to apparatus for decoding digital data encoded according to a convolutional code which is such that the data may be represented as a path defined by a succession of transitions between a finite number of states, the apparatus having input means for receiving encoded data signals, decoder means for decoding said encoded data signals, and synchronisation error detector means for detecting synchronisation errors in the encoded data signals.

The invention is particularly applicable for use in a Viterbi type decoder such as described in the following articles:

(1) A J Viterbi, "Convolutional codes and their performance in Communications Systems", IEEE Transactions on Communications Technology, Vol. COM-19, No. 5, October 1971, Pages 751-772.

(2) J A Heller and I M Jacobs, "Viterbi decoding for Satellite and space communications", IEEE Transactions on Communications Technology, Vol. COM-19, No. 5, October 1971, Pages 835-848.

Correct decoding of such encoded data cannot be achieved if there are synchronisation errors in the input encoded data, for example arising from phase synchronisation errors in a modem from which the encoded data is supplied to the decoding apparatus.

One method of detecting synchronisation errors which has been proposed in the prior art involves monitoring the growth of the path metrics associated with all of the states. In one specific proposal, the spread between the maximum path metric and the average of the other path metrics is calculated and a phase synchronisation error indicated if this spread is less than a certain value. In another proposal, described in UK patent specification No. 1,478,736 published in 1975, the difference between the maximum and second to maximum path metrics is calculated to obtain an indication of whether or not there are any phase synchronisation errors. Both proposals involve identifying the maximum path metric. The state at which this appears will of course change at each calculation. Accordingly, complex and therefore expensive circuitry is needed in these prior art proposals in order to monitor the metrics associated with all of the states so that the maximum metric can be identified and then to carry out comparisons between this maximum metric and a metric or metrics associated with one or more other states. The problem underlying the invention is to provide a means for detecting synchronisation errors which is much simpler than is provided by the prior art.

The apparatus according to the invention is characterised, in one aspect, by means for repeatedly calculating for a selected path terminating in a selected state a quantity dependent upon the relationship between said selected path and the received encoded data signals, the synchronisation error detecting means being arranged to monitor said quantity and to determine synchronisation errors from the behaviour of said quantity relative to time.

Preferably, the quantity in question is a metric. In another aspect, the invention includes means for calculating metrics associated with paths terminating at each of the states, the decoder means being operable to decode the encoded data signals utilizing said path metrics, and the apparatus is characterised in that the synchronisation error detecting means is arranged to monitor a selected path metric associated with one of said states and to determine synchronization errors from the behaviour of said selected path metric without reference to the behaviour of metrics associated with other states.

In this way, the invention solves the above problem.

In a preferred embodiment, the selected state, is a state having itself as a predecessor.

Since only one metric is monitored, the apparatus according to the present invention is much simpler than prior art apparatus.

In a particularly preferred embodiment, the difference, which may be a weighted difference, between the growth of the selected metric and the sum of the absolute values of the input encoded data is measured and compared with a threshold to determine whether or not synchronisation errors exist.

The invention is described further by way of example with reference to the accompanying drawings in which:

FIG. 4 is a block diagram of a receiving apparatus for receiving the data transmitted by the apparatus of FIG. 1, and including a Viterbi decoder according to an embodiment of the present invention; and FIG. 5 is a block diagram showing in more detail a phase synchronisation detecting circuit which is included in the apparatus of FIG. 4; and

DATA ENCODING

Figure 1:
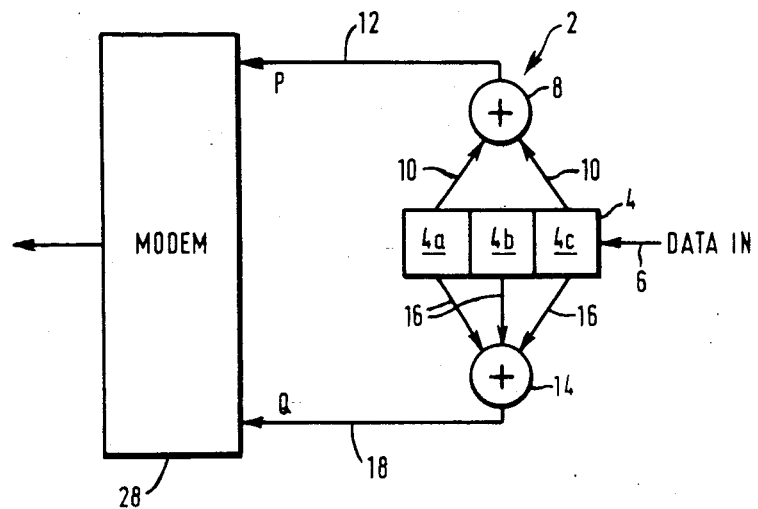
FIG. 1 is a block diagram of a data transmitting apparatus including a convolutional encoder for producing encoded data which may be decoded utilizing a decoder according to the present invention.

The apparatus of FIG. 1 comprises a conventional convolutional data encoder 2. This comprises a 3 bit shift register 4 into the right-hand end of which data to be encoded is supplied via supply line 6. A first modulo-2 gate 8 has two inputs 10 connected respectively to the first and last stages 4a and 4c of the shift register 4 and a single output line 12 on which an output signal P is generated. A second modulo-2 gate 14 has three inputs 16 connected respectively to the three stages 4a, 4b and 4c of the shift register 4 and a single output 18 on which an output signal Q is generated. As is well known, each of the modulo-2 gates 8 and 14 will generate a binary 1 output if there is an odd number of binary 1's applied to its inputs and will otherwise generate a binary 0.

Accordingly, by way of example, if the contents of the shift register are initially zero, an input data sequence 011010 ... will produce the encoded data output P,Q shown in the following Table 1:

TABLE 1

| Shift Reg. Contents | P Q |
|---|---|
| 000 | 00 |
| 001 | 11 |
| 011 | 10 |
| 110 | 10 |
| 101 | 00 |
| 010 | 01 |

Figure 2:
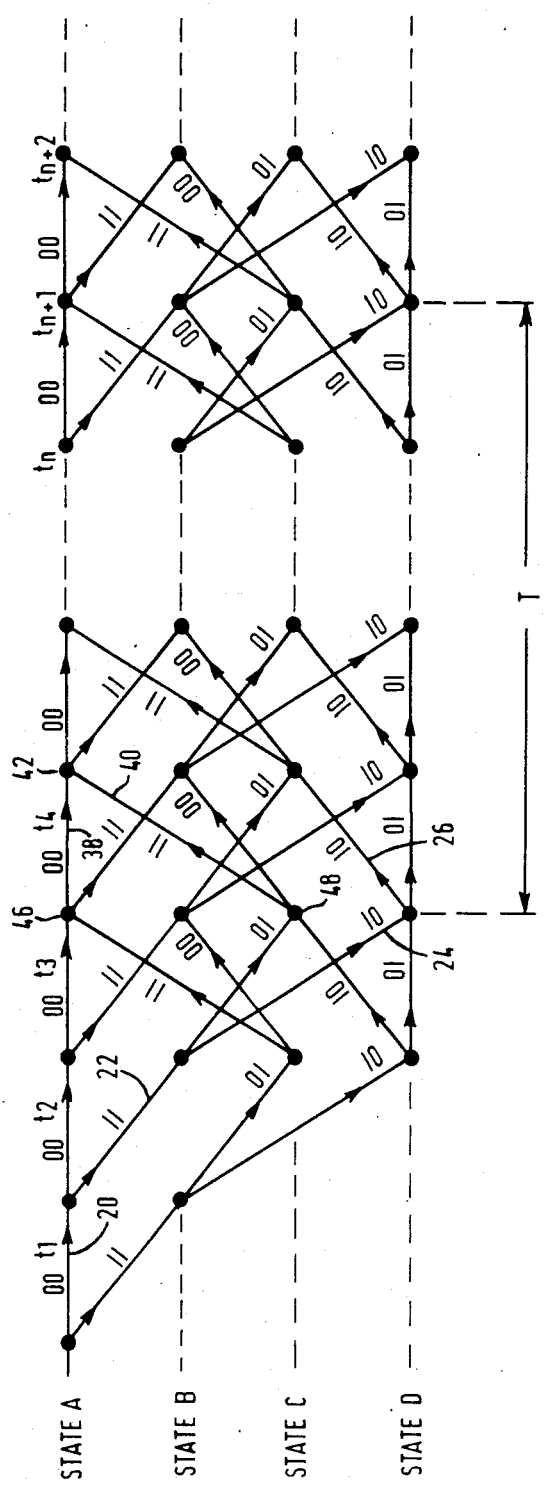
FIG. 2 is a trellis diagram illustrating the operation of the encoder of FIG. 1.

As is well known, the operation of a convolutional encoder involves a sequence of transitions between a finite number of states and these may be represented by a trellis diagram as shown in FIG. 2. The encoder shown in FIG. 1 has four states A to D. These states may be defined in terms of the encoded output signal P,Q produced in response to a data input of binary 1 or binary 0. For example, state A is that state which outputs an encoded signal 00 in response to an input of binary 0 and an encoded output of 11 in response to an input of binary 1. The encoded output produced when the encoder is in each of states A to D is shown in Table 2 below, which also shows the next following state in each case:

TABLE 2

| State | Input Bit | Encoded Output | Next State |
|---|---|---|---|
| A | 0 | 00 | A |
|   | 1 | 11 | B |
| B | 0 | 01 | C |
|   | 1 | 10 | D |
| C | 0 | 11 | A |
|   | 1 | 00 | B |
| D | 0 | 10 | C |
|   | 1 | 01 | D |

Thus, it can be seen that state A can only be succeeded by a further state A or state B, state B can only be succeeded by state C or state D etc. Conversely, state A can only be entered from state A or state C, state B can only be entered from state A or state C etc. Thus, each state has two possible successor states and two possible predecessor states.

A data sequence input into the encoder of FIG. 1 may be represented as a path through the trellis diagram of FIG. 2. In the trellis diagram, if at any point the next received data bit is a binary 0, the resulting next state is found by following the upper of the two branches leading from the current state whereas if the next data input is binary 1, the next state is found by following the lower of these two branches. With this in mind, the path through the trellis diagram representing any input data sequence may easily be traced and this path will indicate the successive transitions between these states through which the encoder passes in response to this input data sequence. Further, the branches in FIG. 2 are labelled 00, 01, 10, or 11 to indicate the output encoded data P,Q corresponding to that branch or transition between the states.

Taking the example of the data sequence 011010 . . . discussed above and assuming that the contents of the shift register 4 are initially zero the succession of states through which the encoder passes may be traced throught the trellis diagram of FIG. 2 as follows. During interval $t_1$, the input data bit is zero, the encoded output is 00 and the state goes along branch 20 from the predecessor state A to the next state A. During interval $t_2$, when a binary 1 is input to the right-hand end of the shift register 4, the encoded data output is 11 and a transition from state A to state B takes place along branch 22. Similarly, when the next binary 1 is input, the state changes along branch 24 from state B to state D and then, for the next input data bit, which is binary 0, changes along branch 26 from state D to state C, and so on.

ENCODED DATA TRANSMISSION

Figure 3:
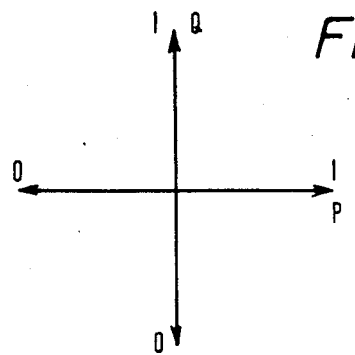
FIG. 3 is a phase diagram illustrating the way in which the encoded data produced by the apparatus of FIG. 1 may be transmitted.

In the embodiment under discussion, the encoded data P,Q is supplied to a modem 28 and transmitted using quadrature modulation as shown in FIG. 3 in which P=1 and P=0 are respectively represented by subcarrier phases of 0° and 180° and Q=1 and Q=0 are respectively represented by sub-carrier phases of 90° and 270°.

DATA RECEIVING

The receiving apparatus shown in FIG. 4 shows a receiving modem 30 which receives the quadrature modulated encoded data from transmitting modem 28 and derives therefrom the P and Q signals. The invention is equally applicable to a "soft" decoding process in which the received signals P and Q are quantized to several levels and then each is represented by a 3 bit word and hard decoding process in which the demodulated P and Q signals are quantized to a single level and represented by a single bit. Although the aim of the receiving modem 30 is to regenerate the encoded data sequence P,Q supplied to the transmitting modem 28, inevitably there will be errors in the sequence P,Q output by the modem 30 as a consequence of noise. It will be apparent from consideration of the trellis diagram of FIG. 2 that only certain sequences of encoded data P,Q can be generated by the encoder and these errors arising from noise may result in sequences being output by the modem 30 which could not have been generated by the encoder. For example, the sequence

. . . 11 01 10 . . .

could not be generated by the encoder. More particularly, the first digits 11 in the above sequence can only be generated if the encoder is already in either state A or state C. Assuming it is in state A, the digits 11 indicate a transition to state B and the digits 01 indicate a transition from state B to state C but, as can be seen from the trellis diagram, neither of the branches leading out of state C corresponds to the next pair of digits 10. If, on the other hand, it is assumed that the encoder is initially in state C, the digits 11 indicate a transition to state A but neither of the branches leading from state A correspond to the next pair of digits 01. Thus, the above sequence 11 01 10 clearly does not correspond to any valid path through the trellis diagram.

DATA DECODING

The output of the modem 30 is supplied to a Viterbi decoder 32 whose function, as is well known, is to determine for the data sequence P,Q output by the modem 30 and containing errors, which of the possible paths through the trellis diagram most likely corresponds to the path generated by the encoder. This determination is made by calculating a quantity known as the metric for each of the possible valid paths in relation to the received data sequence P,Q. The metric of a particular valid path is dependent upon the degree of "fit" or similarity between the received encoded data sequence and the data sequence represented by that path. Thus, the greater the metric, the greater the likelihood that the particular valid path corresponds to the encoded data sequence generated by the encoder. Thus, having determined which of the possible valid paths has the highest metric, that path is used for generating the decoded data sequence.

In the Viterbi decoder 32 shown in FIG. 4, the encoded data sequence P,Q is supplied through a phase correction circuit 34, to be described subsequently, to a branch incremental metric calculator 36 which, following each transition, calculates for each of states A to D the two branch incremental metrics leading into that state. By way of example, following interval $t_4$ in FIG.

2 branch incremental calculator 36 compares the signals P,Q received during interval $t_4$ with the two possible values 00 and 11 (assuming "hard" decoding in the modem) for P,Q represented by the branches 38 and 40 leading into the A-state 42 which follows interval $t_4$. The incremental metrics thus obtained are supplied to metric up-dating circuit 44 which adds the incremental metric for branch 38 to the previously obtained metric of predecessor state A indicated by reference No. 46 and adds the incremental metric for branch 40 to the previously obtained metric for predecessor state C indicated by reference No. 48 in FIG. 2. In this way, metric up-dating circuit 44 obtains the up-dated metric for the two possible paths terminating via branches 38 and 40 at A-state 42. Metric up-dating circuit 44 then determines which of these two metrics is the greater and thereby determines which of the two paths leading into A-state 42 is more likely to correspond to the transmitted encoded data. The one with the lower metric is discarded and the one, called the survivor, with the higher metric is stored in terms of its path history and with its up-dated metric in random access memory 50.

Branch incremental metric calculator 36 and metric up-dating circuit 44 perform the same process for each of states B, C and D. Further, this process is repeated for all of states A to D following the receipt of each new encoded signal P,Q. Thus, the random access memory 50 stores four survivor path histories and their associated metrics. It may be noted at this point that, as well known in this art, it would not be possible to store the entire length of each path history since this may be infinite and accordingly random access memory 50 stores only a selected length of each path history.

Best path selection circuit 52 selects from the random access memory 50 that path which has got the highest metric and causes output circuit 54 to output in response to this selection, the appropriate output data sequence on output line 56.

Circuit 59 controls the timing of the operations performed in the circuits 34, 36, 44, 50, 52 and 54 in decoder 32.

PHASE ERRORS

It can be readily seen from FIG. 3 that phase ambiguities may arise in the modem 30 as a consequence of which the signals P and Q may be transposed in the output to the modem. If this happens, it will be readily apparent that correct decoding of this data cannot be achieved. Accordingly, a phase synchronising detecting circuit 58 is provided. This has a first input 60 to which the metric of the survivor path of state A is supplied following each determination thereof and a second input 62 to which the input encoded data sequence P,Q is supplied. Timing circuit 59 also controls circuit 58.

PHASE ERROR DETECTION

The present embodiment of the invention provides a simple method of detecting phase errors by monitoring the growth of the metric associated with a single one of the states A to D. In the embodiment under discussion, the metric which is monitored is the metric associated with state A. As seen from Table 2 above, state A is one of the two states having itself as a predecessor, the other being state D. In the arrangement shown in FIG. 5, growth calculator circuit 64 receives via input 60 the new metric of state A after each calculation of the incremental metrics and determination of the survivor path. Circuit 64 determines the difference between the new value of this metric and the previous value of this metric and adds this difference to the cumulative sum of such differences previously stored in memory 66. The new values of the metric and of the cumulative sum are then stored in memory 66. This is repeated for a time T which is calculated as a selected number of data bit periods. The value of the cumulative sum stored in memory 66 increases on average at a certain rate during the period T. If there is a phase error the rate of increase of the cumulative sum in the memory 66 will normally be less than if there is no phase error.

The rate of increase of the cumulative sum in memory 66 will depend partly upon the values of the incoming data sequences in addition to depending upon the presence or absence of phase errors. To take account of this, the input data sequences P,Q supplied to input 62 of the circuit 58 are supplied to a circuit 72 which, each time a new signal P,Q arrives (and assuming "soft" decoding in the modem), sums the absolute values of these two signals and adds the result to the previous cumulative sum of such additions stored in memory 74. The value stored in memory 74 also increases during period T. Difference circuit 78 calculates the difference between the values of the cumulative sums stored in memories 66 and 74 following each calculation performed by circuits 64 and 72 and stores the result in memory 80. At the end of period T comparator circuit 82 compares the value in memory 80 with a threshold value stored in threshold circuit 84. If the comparison performed by comparator 82 indicates that the value in memory 80 is greater than the threshold, then there is no phase error but if it is less than the threshold there is a phase error. In these circumstances, comparator circuit 82 outputs a change phase decision bit on line 86 which is applied to phase correction circuit 88 which applies a correction to the signals P and Q to compensate for the phase error. It will be recognised from consideration of FIG. 3, that any of four possible phase errors may arise. Thus, the phase correction circuit 88 is arranged to apply corrections which are equivalent to stepping through these phases one at a time, with the circuit 58 carrying out the measurement described with reference to FIG. 5 following each step until the comparison performed by comparator 82 indicates that the phase error has been correctly compensated for. The various circuits in FIG. 5 and the memories 66, 74 and 80 are reset at the beginning of each measuring cycle.

The time period T may be chosen according to the design of decoder employed. Typically, it may be a few hundred bit times. Similarly, the threshold value will be determined according to the performance of the decoder in question.

VARIATIONS

A number of variations are possible within the scope of the invention. For example, although in the embodiment so far described, the metric associated with state A has been supplied to the circuit 58, it would be possible for metrics associated with other states to be used. However, it is preferred to use the metric associated with a state which has itself as a predecessor i.e. with the encoder of FIG. 1 this means state A or state D. Further, the sum of two metrics, e.g. those associated with states A and D could be supplied to circuit 58 to detect synchronisation errors in accordance with the invention. The details of circuit 58 would of course be appropriately modified as necessary.

Although it has been found preferable to compare the growth of the metric associated with a selected state with the sum of the absolute values as described with reference to FIG. 5 to determine whether or not there is a phase error, it would alternatively be possible simply to detect the rate of growth of the metric of the selected state. Various possible methods of measuring the rate of growth could be used. One such method is to calculate the growth over a selected period of time and then compare it to a threshold. Another would be to calculate the time taken for the metric to grow by a preselected fixed amount and then determine whether this time is greater than or less than a threshold time.

Although it is preferred to monitor a metric of a selected state to determine phase errors, the invention could alternatively be carried out by measuring some other quantity dependent upon the difference or similarity between a path terminating in the selected state and the received encoded data.

Although only one form of convolutional encoder has been illustrated in FIG. 1, the invention may be used with encoded signals produced by other forms of convolutional encoder. As is well known, different encoders produce trellis diagrams with different numbers of states and different numbers of branches leading into and out of each state.

Although the invention has been illustrated in connection with a modem utilizing phase quadrature modulation, the invention may be utilized in decoders associated with other transmission systems. Further, the invention may be useful for detecting lack of synchromism other than the type of phase errors so far described.

In the embodiment shown in FIG. 4, the output of the phase synchronisation detection circuit 58 has been applied to a phase correction circuit 88. As an alternative, the output of circuit 58 could be applied to the modem 30 to effect a change in the reference phase used for demodulation or could be used in any other way to enable the detected synchronisation error to be corrected.

Although the invention has been described particularly with reference to a Viterbi decoder as this is a particularly advantageous device for decoding convolutionally encoded data, the invention could be applied to any decoder in which a metric is or could be calculated.

Although in the circuit shown in FIG 5, the difference circuit 78 calculates the difference between the values in the memory 66 and 74 every bit period, this is not essential. Alternatively, a single difference calculation could be performed at the end of period T for example.

Instead of comparing the growth of the metric associated with the selected state to a threshold as described it would be possible, in order to find the correct phase of the data, simply to step through each of the possible phases and measure the metric growth at each step. The correct phase would then be the one with the maximum growth of the metric.

Various changes may of course be made in the details of the circuit of FIG. 5. For example, the circuits 64 and 72 may be arranged to introduce scaling factors or to add in constants as necessary to suit the particular design of hardware with which the invention is to be employed, for example to take into account the fact that as the metric grows it may overflow its storage. Further, where "hard" decoding is carried out by the modem, the sum of absolute values circuit would preferably be arranged to subtract a constant, at each calculation, such constant being for example $\frac{1}{2}$ in order to avoid the cumulative sum increasing too rapidly.

It has been found that the method of detecting according to the invention which has been described is highly reliable.

We claim:

1. Apparatus for decoding digital data encoded according to a convolutional code which is such that the data may be represented as a path defined by a succession of transitions between a finite number of states comprising:

input means for receiving encoded data signals;

means connected to said input means for calculating metrics associated with paths terminating at said states;

means connected to said calculating means for decoding said encoded data utilizing said path metrics; and synchronization error detecting means connected to said calculating means for monitoring a path metric associated with a said state, said synchronization error detecting means determining synchronization errors from the behavior of said associated path metric without reference to the behavior of other path metrics relative to said associated path metric.

2. Apparatus according to claim 1, wherein said synchronization error detecting means is arranged to monitor the rate of growth of said associated path metric.

3. Apparatus according to claim 1, including correcting means responsive to the output of said synchronisation error detecting means for correcting for said synchronisation error when detected.

4. Apparatus according to claim 3, wherein said correcting means steps through a correction sequence until said synchronisation error detecting means fails to detect any further synchronisation error.

5. Apparatus according to claim 1, wherein said means for decoding is a Viterbi decoder.

6. Apparatus for decoding digital data encoded according to a convolutional code which is such that the data may be represented as a path defined by a succession of transitions between a finite number of states comprising:

input means for receiving encoded data signals;

means connected to said input means for calculating metrics associated with paths terminating at said states;

means connected to said calculating means for decoding said encoded data utilizing said path metrics; and synchronization error detecting means connected to said calculating means and for monitoring a path metric associated with a said state having itself as a predecessor, said synchronization error detecting means determining synchronization errors from the behavior of said associated path metric independently of the behavior of other path metrics relative to said associated path metric.

7. Apparatus for decoding digital data encoded according to a convolutional code which is such that the data may be represented as a path defined by a succession of transitions between a finite number of states comprising:

input means for receiving encoded data signals;

means connected to said input means for calculating metrics associated with paths terminating at said states;

means connected to said calculating means for decoding said encoded data utilizing said path metrics; and synchronization error detecting means connected to said calculating means for monitoring a path metric associated with a said state, said synchronization error detecting means determining synchronization errors from the behavior of said associated path metric independently of the behavior of other path metrics relative to said associated path metric, said synchronization error detecting means monitoring the rate of growth of said associated path metric by calculating, for each new value of said associated path metric, the difference between said new value and the previous value thereof and adding said difference to the previous cumulative sum of said differences.

8. Apparatus according to claim 7, wherein said synchronization error detecting means includes means for defining a measuring time period, means for forming said cumulative sum over said time period, means for forming over the same time period a further cumulative sum, said further cumulative sum being the sum of the absolute values of the input encoded data signals, and means for comparing the difference between said cumulative sum and said further cumulative sum with a threshold at the end of said time period.

9. Apparatus according to claim 8, wherein said synchronization error detecting means adds a constant into said cumulative sum and said further cumulative sum.

10. Apparatus for decoding digital data encoded according to a convolutional code which is such that the data may be represented as a path defined by a succession of transitions between a finite number of states comprising:

input means for receiving encoded data signals;

means connected to said input means for calculating metrics associated with paths terminating at said states;

means connected to said calculating means for decoding said encoded data utilizing said path metrics; and synchronization error detecting means connected to said calculating means for monitoring a path metric associated with a said state, said synchronization error detecting means determining synchronization errors from the behavior of said associated path metric independently of the behavior of other path metrics relative to said associated path metric, said synchronization error detecting means monitoring the rate of growth of said associated path metric by monitoring the difference between the rate of growth of said associated path metric and the rate of growth of the sum of the absolute values of the input encoded data signals.

11. Apparatus according to claim 10, wherein said synchronisation error detecting means comprises a comparator for comparing said difference to a threshold.

12. Apparatus for decoding digital data encoded according to a convolutional code which is such that the data may be represented as a path defined by a succession of transitions between a finite number of states comprising:

input means for receiving encoded data signals;

means connected to said input means for calculating metrics associated with paths terminating at said states;

means connected to said calculating means for decoding said encoded data utilizing said path metrics; and synchronization error detecting means connected to said calculating means for monitoring a path metric associated with a said state, said synchronization error detecting means determining synchronization errors from the behavior of said associated path metric independently of the behavior of other path metrics relative to said associated path metric;

said apparatus further comprising a modem for supplying said encoded signals to said input means, said synchronization error detecting means detecting phase errors in said modem.

13. Apparatus for decoding digital data encoded according to a convolutional code which is such that the data may be represented as a path defined by a succession of transitions between a finite number of states comprising:

input means for receiving encoded data signals;

means connected to said input means for repeatedly calculating for a path associated with a said state a quantity dependent upon a relationship between said associated path and the received encoded data signals;

means coupled to said input means for decoding said encoded data signals; and synchronization error detecting means connected to said calculating means for monitoring said quantity, said synchronization error detecting means determining synchronization errors from the behavior of said quantity relative to time but without reference to the behavior of said quantity relative to the behavior of other such quantities of other said paths.

14. Apparatus for decoding digital data which is such that the data may be represented as a path defined by a succession of transitions between a finite number of states, said apparatus being operable in accordance with the Viterbi algorithm and comprising:

input means for receiving data signals;

means connected to said input means for calculating metrics associated with paths terminating at said states;

means connected to said calculating means for decoding said data utilizing said path metrics; and synchronization error detecting means connected to said calculating means for monitoring a said path metric associated with said state, said synchronization error detecting means determining synchronization errors from the behavior of said associated path metric without reference to the behavior of other said path metrics relative to said associated path metric.

15. Apparatus for decoding digital data encoded according to a convolutional code which is such that the data may be represented as a path defined by a succession of transitions between a finite number of states comprising:

input means for receiving encoded data signals;

means connected to said input means for calculating metrics associated with paths terminating at said states;

means connected to said calculating means for decoding said encoded data utilizing said path metrics; and synchronization error detecting means connected to said calculating means for monitoring a said path metric associated with a single said state having itself as a predecessor, said synchronization error detecting means determining synchronization errors from the rate of growth of said associated path metric, and said synchronization error detecting means performing said monitoring without reference to the behavior of other path metrics relative to said associated path metric.

* * * * *